United States Patent [19]

Winstel et al.

[11] 3,762,943

[45] Oct. 2, 1973

[54] PROCEDURE AND PREPARATION FOR THE PRODUCTION OF HOMOGENEOUS AND PLANE PARALLEL EPITACTIC GROWTH LAYERS OF SEMICONDUCTING COMPOUNDS BY MELT EPITAXY

[75] Inventors: Gunter Winstel; Peter Jochen, both of Munich, Germany

[73] Assignee: Siemens Aktiengesellschaft, Berlin & Erlangen, Germany

[22] Filed: July 13, 1970

[21] Appl. No.: 54,280

[30] Foreign Application Priority Data

July 17, 1969 Germany .................. P 19 36 443.3

[52] U.S. Cl. ............... 117/201, 23/273 SP, 29/580, 148/1.5, 148/171

[51] Int. Cl. ............................................ H01l 7/56

[58] Field of Search .................................... 117/201; 148/171–173; 23/273 R, 295, 273 SP

[56] References Cited

UNITED STATES PATENTS

| | | | |
|---|---|---|---|
| 3,467,557 | 9/1969 | Sterling | 117/201 |
| 3,537,919 | 11/1970 | Bittman | 117/251 X |
| 3,411,946 | 11/1968 | Tramposch | 117/201 |

OTHER PUBLICATIONS

H. Rupprecht, "New Aspects of Solution Regrowth in the Device Technology of Gallium Arsenide" in Proc. of the 1966 Symposium on GaAs in Reading ed. Inst. Pysics. and Physical Soc. Paper No. 9 pp. 57–61

*Primary Examiner*—Alfred L. Leavitt
*Assistant Examiner*—David A. Simmons
*Attorney*—Curt M. Avery, Arthur E. Wilfond, Herbert L. Lerner and Daniel J. Tick

[57] ABSTRACT

Process and apparatus for preparing doped plane parallel epitactic growth layers of semiconducting compounds, especially GaAs, by melt epitaxy, using a non-stoichiomecric metal melt. A thick walled cylindrical melting crucible is used to receive the semiconducting compound. A cooling finger capable of being unscrewed is near the bottom of the melt area. A substrate is placed between the hollow crucible and the cooling finger, by a thermal resistance which increases toward the center in that portion of the cooling finger on which the substrate bears, so that the temperature gradient, before and during epitactic coating, is in the axial direction only and not in the radial direction thereby resulting in very planar growth layers.

12 Claims, 3 Drawing Figures

PROCEDURE AND PREPARATION FOR THE PRODUCTION OF HOMOGENEOUS AND PLANE PARALLEL EPITACTIC GROWTH LAYERS OF SEMICONDUCTING COMPOUNDS BY MELT EPITAXY

The invention concerns a procedure for the production of homogeneous and plane parallel epitactic growth layers of semiconducting compounds, preferably of gallium arsenide, by the use of a melt epitaxy process which does not employ a stoichiometric metal melt.

Technically, it is extremely difficult to apply epitactic layers of nearly stoichiometric gallium arsenide melts upon a gallium arsenide substrate, since one difficulty is that the semiconducting $A^{III}B^{V}$— compounds form single phases, which do not decompose and another is that the arsenic vapor pressure over the gallium arsenide is about 1 atm at the latter's melting point of the gallium arsenide. However, if one turns from a stoichiometric compound to work with a gallium rich melt, both the gallium and gallium arsenide phases remain existent next to each other and during the cooling of the mixture, only the gallium arsenide phase in gallium precipitates. This offers distinctive advantages vis-a-vis the stoichiometric gallium arsenide melt.

1) the dissociation pressure of the gallium arsenide is lower than the arsenic partial pressure at melting point of the gallium arsenide;

2) the solid gallium arsenide is obtained at lower temperature.

The result of this is not only that a smaller amount of apparatus is entailed, but also that the crystallization out of the gallium rich melt means an additional gain in terms of purification, since the distribution coefficient, which must be appropriately defined for foreign bodies, are less than 1 for some foreign substances. Further, the melt epitaxy allows the production of p-conducting silicon doped gallium arsenide. The introduction of silicon predominantly at acceptor areas occur only below a certain growth temperature, whereas the silicon doped gallium arsenide forced out of the stoichiometric compound has always heretofore exhibited n-conducting characteristics.

With the known epitactic melting process involving the use of a gallium rich gallium arsenide melt, the substrate temperature at the start of the process is about 950° C and toward the end (layer thickness, 100$\mu$) only about 800° C or less. This means that the epitactic layer grows under changing experimental conditions, as for instance, temperature and speed of layer growth. Beyond this, the obtainabile layer thickness is limited by this procedure.

The object of the present invention is to produce growth layers having homogeneous layer thickness, that is with the growth process taking place under constant temperature conditions. We achieve this through the use of a cylindrical melting crucible having a thick walled hollow body to receive the semiconducting compound and a cooling finger capable of being unscrewed. The substrate to be used for the epitactic coating is inserted between the hollow body and the cooling finger, and by creating a thermal resistance, which increases with proximity to the center, at the bearing surface for the substrate at the thread part of the cooling finger, so that the temperature gradient becoms effective before as well as during the epitactic coating, practically only in axial and not in radial direction.

This process, under which thermal diffusion is utilized under constant temperature conditions, results in epitactic growth layers which exhibit a high degree of homogenity with respect to their layer thickness as well as the distribution of doping over the entire substrate surface. The thermal diffusion and the condensation determine the speed of layer growth at every point of the epitactic layer. They are to be considered as a kind of serial connection during the growth process so that the slower of the two processes determines the speed of growth. This provides the conditions for temperature distribution in the melting crucible and on the substrate for the formation of homogeneous layer thickness. This requirement is to be met by the process according to the invention, since because of the thermal resistance, that increases towards the center of the high-polished bearing surface for the substrate, at the thread part of the cooling finger, the speed of layer formation at the center, decreases in radial direction at the boundary crystal melt, as a result of the decreased temperature gradient.

According to another feature of the invention, to achieve the thermal resistance, the bearing surface as well as the side of the substrate facing the bearing surface or at least one of these surfaces is lapped planar with a 15$\mu$ diamond paste.

In another embodiment, at least one hole is drilled into the center of the bearing surface for the substrate. It has proved to be especially advantageous, however, to use a bearing surface which has one large central bore which is surrounded by smaller bores placed in concentric circles. The same effect is achieved, when a heat insulating disc of appropriate thickness and preferably of a high melting oxide like quartz, is used as the thermal resistance.

A further ramification of the invention is the separated heating of the substrate and the molten semiconductive compound in the crucible. It is especially advantageous to use spectral graphite in the construction of both parts of the crucible and to coat pyrolytically the surface of these parts with a layer of hard carbon, in order to eliminate dust.

To further increase purity, it is especially useful to heat the crucible, before use, an hour at 1,800° C in ultra high vacuum. It is advisable to perform the coating process under protective gas, for instance, in a hydrogen or nitrogen atmosphere.

The process under terms of the invention is made possible by a device characterized by the fact that a cylindrical crucible is employed which holds the melting compound. This crucible is placed in a quartz oven, and is rotatable with the latter, along an axis perpendicular to the central axis. Further, the crucible consists of two parts of which one is a thick walled hollow tubular body and the other an unscrewable cooling finger. The process is further characterized by the fact that means are provided, whereby a substrate wafer can be inserted between the hollow body and the cooling finger. Furthermore, increasing resistance toward the center is provided on a substrate bearing surface, at the thread part of the cooling finger. An inductance coil is used for heating of the crucible. The inductance coil is arranged outside the oven. Means are provided through which the epitactic coating can be carried out under a protective gas atmosphere.

Further details of the invention are more closely explained in the following Examples with reference to the drawing, in which:

FIG. 1 schematically shows the quartz oven;

Figure 1:
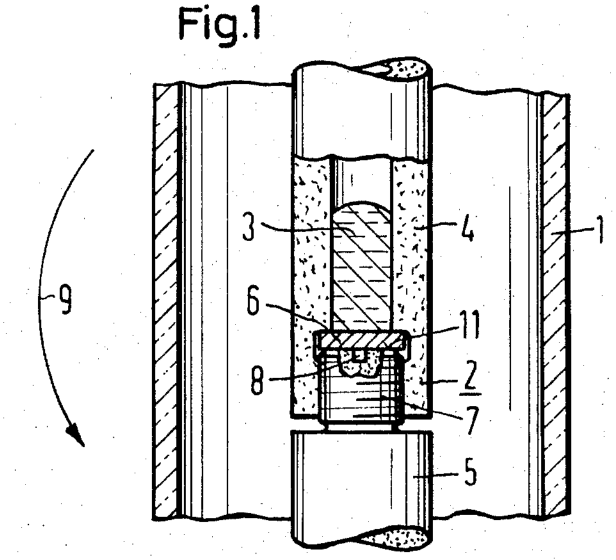

FIG. 1 shows in schematic cross section a quartz tube 1 which serves as an oven, and in which a cylindrical melt crucible 2 is placed. This crucible consists of a thick walled hollow tube 4, holding the gallium-gallium arsenide melt 3 and a cooling finger 5 furnished with a thread part 7. The gallium arsenide crystal substrate wafer 6, which is provided for the epitactic coating, is placed between hollow tube 4 and cooling finger 5. In the center of the bearing surface 11 for the substrate wafer 6 is a bore 8 which was drilled out at the thread part of the cooling finger 5. This prevents radial temperature gradients which affect heat dissipation from the substrate wafer thereby making it possible to obtain a thick growth at the center of the substrate wafer of equal thickness to that at the edge. FIG. 1 shows the stage of growth of the epitactic layer, after the melt 3 has been tilted over onto the substrate 6. Before the tilting takes place, the gallium-gallium arsenide melt is heated to 820° C by an induction heater (not shown in the Figure). The heater may be a coil surrounding oven 1. The heating to 820° C may be with the crucible and the oven in the horizontal plane. Thereafter the crucible and the oven are rotated as indicated in FIG. 1 by arrow 9 to place the melt in contact with the substrate that has been heated to the same temperature. Purified hydrogen is used as protective gas during the process. The speed of layer growth when the substrate temperature is 820° C, is approximately $80/\mu/h$.

Figure 2:
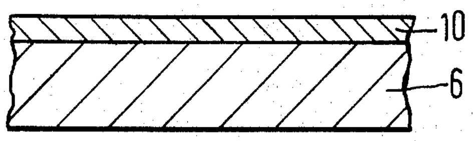
FIG. 2 shows a coated GaAs wafer.
Figure 3:
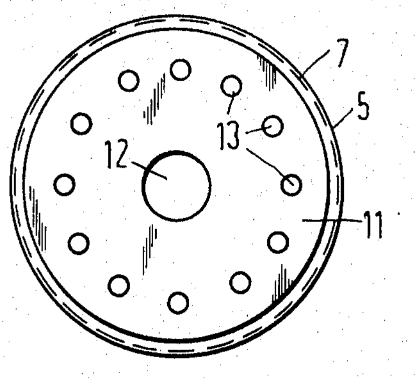
FIG. 3 shows the bearing surface for the substrate.

FIG. 2 shows a gallium arsenide wafer 6 furnished with an epitactic layer 10. In FIG. 3, which shows the bearing surface 11 for the substrate, an especially effective application of the invention provide for a larger size bore 12 surrounded by smaller bores 13 in concentric circles.

It is also possible to produce appropriately doped layers (which are either n-silicon doped or p-gallium arsenide layers) and in this fashion to manufacture diodes and transistors of gallium arsenide, for example luminescence diodes, or other semiconducting compounds. A tin-germanium alloy is also suitable for doping the bodies to be suitable for luminescence diodes.

Gallium arsenide substrates of 8 mm diameter can be provided with an epitactic growth layer whose relative thickness which does not vary more than 20 percent for a total thickness of $100\mu$ measured over the entire cross section of the epitactically coated area. The semiconductor devices produced in this way, are especially well suited for the manufacture of Gunn diodes made of gallium arsenide.

A gallium arsenide containing epitactic growth layer may be produced from a non-stoichiometric gallium with gallium arsenide metal melt. The temperature of the gallium arsenide substrate and the temperature of the gallium with gallium arsenide which is apart from the substrate, are brought to at most 900° C.

We claim:

1. A process for the preparation of doped plane parallel epitactic growth layers of gallium arsenide by melt epitaxy using a non-stoichiometric gallium rich arsenide melt, which comprises using a cylindrical melt crucible having a cylindrical axis to receive the gallium arsenide melt, a threaded cooling finger near the bottom of the melt, placing a substrate between the hollow crucible and the cooling finger, and creating a thermal resistance which increases toward the center at a bearing surface for the substrate at the thread part of the cooling finger on which the substrate bears, so that the temperature gradient, before and during epitactic coating, is in the axial direction only, separately heating the gallium arsenide substrate and the gallium rich gallium arsenide to a temperature of at most 900° C and bringing the gallium rich gallium arsenide melt into contact with the gallium arsenide substrate by rotating the melt crucible along an axis perpendicular to the cylindrical axis of said melt crucible.

2. The process of claim 1, wherein at least one of the bearing surfaces or the side of the substrate facing the bearing surface is planar lapped.

3. The process of claim 1, wherein at least one hole is bored into the center of the bearing surface for the substrate.

4. The process of claim 3, wherein there is in the bearing surface one large central hole with several smaller holes concentrically arranged around said central hole.

5. The process of claim 1, wherein a thermal insulating disc of appropriate thickness, of a highly melting oxide, is used as the thermal resistance.

6. The process of claim 5, wherein the insulating disc is quartz.

7. The process of claim 1, wherein the melt crucible is of graphite and consists of a tubular body and a threaded cooling finger, which are pyrolytically coated with a carbon layer.

8. The process of claim 7, wherein the crucible is heated to 1,800° C for an hour in vacuum before its use.

9. The process of claim 1, wherein the temperature is 820° C.

10. The process of claim 9, wherein the growth rate is $80\mu/h$.

11. The process of claim 1, wherein the process is carried out under a protective gas.

12. The process of claim 11, wherein the protective gas is hydrogen or nitrogen.

* * * * *